(12) United States Patent
Zhang et al.

(10) Patent No.: US 9,806,011 B2
(45) Date of Patent: Oct. 31, 2017

(54) NON-UNIFORM SUBSTRATE STACKUP

(71) Applicant: Intel Corporation, Santa Clara, CA (US)

(72) Inventors: Zhichao Zhang, Chandler, AZ (US); Tao Wu, Chandler, AZ (US); Zhiguo Qian, Chandler, AZ (US); Kemal Aygun, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/974,726

(22) Filed: Dec. 18, 2015

(65) Prior Publication Data

US 2016/0104632 A1 Apr. 14, 2016
US 2017/0221727 A9 Aug. 3, 2017

Related U.S. Application Data

(62) Division of application No. 13/707,113, filed on Dec. 6, 2012, now Pat. No. 9,232,639.

(51) Int. Cl.
*H01L 23/498* (2006.01)
*H01L 23/00* (2006.01)

(52) U.S. Cl.
CPC ........ *H01L 23/49822* (2013.01); *H01L 24/81* (2013.01); *H01L 23/49811* (2013.01); *H01L 23/49838* (2013.01); *H01L 2224/16227* (2013.01); *H01L 2924/1432* (2013.01); *H01L 2924/14335* (2013.01); *H01L 2924/1517* (2013.01); *H01L 2924/15311* (2013.01)

(58) Field of Classification Search
None
See application file for complete search history.

(56) References Cited

U.S. PATENT DOCUMENTS

| 5,477,082 A | 12/1995 | Buckley, III et al. |
| 7,994,631 B1 * | 8/2011 | Zhang ............... H01L 23/055 257/691 |
| 9,232,639 B2 | 1/2016 | Zhang et al. |
| 2001/0016407 A1 * | 8/2001 | Schoenfeld ....... H01L 21/76838 438/618 |
| 2002/0153164 A1 * | 10/2002 | Cheng ................. H05K 1/024 174/255 |

(Continued)

FOREIGN PATENT DOCUMENTS

WO  WO 2005048307 A2 *  5/2005 ....... H01L 23/49838

OTHER PUBLICATIONS

High-Speed Board Layout Guidelines, Stratix II Device and Handbook, vol. 2, Altera Corporation, May 2007.*

(Continued)

*Primary Examiner* — Joseph Schoenholtz
(74) *Attorney, Agent, or Firm* — Schwegman Lundberg & Woessner, P.A.

(57) ABSTRACT

Some embodiments described herein include apparatuses and methods of forming such apparatuses. One such embodiment may include a routing arrangement having pads to be coupled to a semiconductor die, with a first trace coupled to a first pad among the pads, and a second trace coupled to a second pad among the pads. The first and second traces may have different thicknesses. Other embodiments including additional apparatuses and methods are described.

11 Claims, 9 Drawing Sheets

(56) References Cited

U.S. PATENT DOCUMENTS

| | | | |
|---|---|---|---|
| 2004/0056344 A1* | 3/2004 | Ogawa | H01L 23/3121 257/686 |
| 2004/0263181 A1* | 12/2004 | Ye | G01R 31/2812 324/534 |
| 2006/0141763 A1* | 6/2006 | Brody | H01L 21/67173 438/622 |
| 2006/0176145 A1* | 8/2006 | Min | H01C 7/006 338/309 |
| 2008/0315977 A1* | 12/2008 | Green | H01P 1/184 333/238 |
| 2009/0282382 A1* | 11/2009 | Zarkesh-Ha | G06F 17/5077 716/129 |
| 2010/0218891 A1* | 9/2010 | Egitto | H01L 21/4853 156/306.9 |
| 2011/0147913 A1* | 6/2011 | Roberts | H01L 23/49811 257/690 |
| 2011/0188552 A1 | 8/2011 | Yoon et al. | |
| 2014/0160707 A1 | 6/2014 | Zhang et al. | |

OTHER PUBLICATIONS

Intel Pentium 4 Processor in the 478 pin Package / Intel 850 Chipset Family Platform Design Guide, Jan. 2003.*

Oleny, B, "Multilayer PCB Stack-up Planning" In-Circuit Design Pty Ltd, 2011.*

Ritchey, L., "Designing a Multiplayer PCB Stackup to Balance Signal Integrity Against Manufacturability and Reliability" IEEE EMC Group, Sep. 13, 2011.*

"Intel Pentium 4 Processor in the 478 pin Package / Intel 850 Chipset Family Platform Design Guide", Jan. 2003.*

"U.S. Appl. No. 13/707,113, Non Final Office Action dated Feb. 20, 2015", 11 pgs.

"U.S. Appl. No. 13/707,113, Notice of Allowance dated Aug. 28, 2015", 11 pgs.

"U.S. Appl. No. 13/707,113, PTO Response to Rule 312 Communication mailed Oct. 19, 2015", 2 pgs.

"U.S. Appl. No. 13/707,113, Response filed Feb. 4, 2015 to Restrictiion Requirement dated Dec. 4, 2014", 7 pgs.

"U.S. Appl. No. 13/707,113, Response filed May 20, 2015 to Non Final Office Action dated Feb. 20, 2015", 19 pgs.

"U.S. Appl. No. 13/707,113, Response filed Sep. 8, 2015 to Notice of Allowance dated Aug. 28, 2015", 5 pgs.

"U.S. Appl. No. 13/707,113, Restriction Requirement dated Dec. 4, 2014", 6 pgs.

* cited by examiner

NON-UNIFORM SUBSTRATE STACKUP

RELATED APPLICATION

This application is a divisional of U.S. patent application Ser. No. 13/707,113, filed Dec. 6, 2012 and published as U.S. Patent Application Publication No. 2014-0160707 on Jun. 12, 2014, which is incorporated herein by reference in its entirety.

TECHNICAL FIELD

Embodiments described herein pertain to semiconductor device packaging. Some embodiments relate to electrical paths in integrated circuit (IC) package substrates.

BACKGROUND

Many electronic items, such as computers (e.g., servers, desktops, laptops, and tablets) and mobile phones, usually have a device included in an IC package. The IC package may include a semiconductor die having circuitry formed thereon that may be part of a device, such as a memory device to store information or a processor to process information. The IC package often has conductive paths coupled to the die. The conductive paths may include traces to carry signals communicated between the device in the IC package and other components in the electronic item. In some situations, if such traces are improperly arranged, the integrity of signals carried by those traces may suffer.

DETAILED DESCRIPTION

Figure 1A:
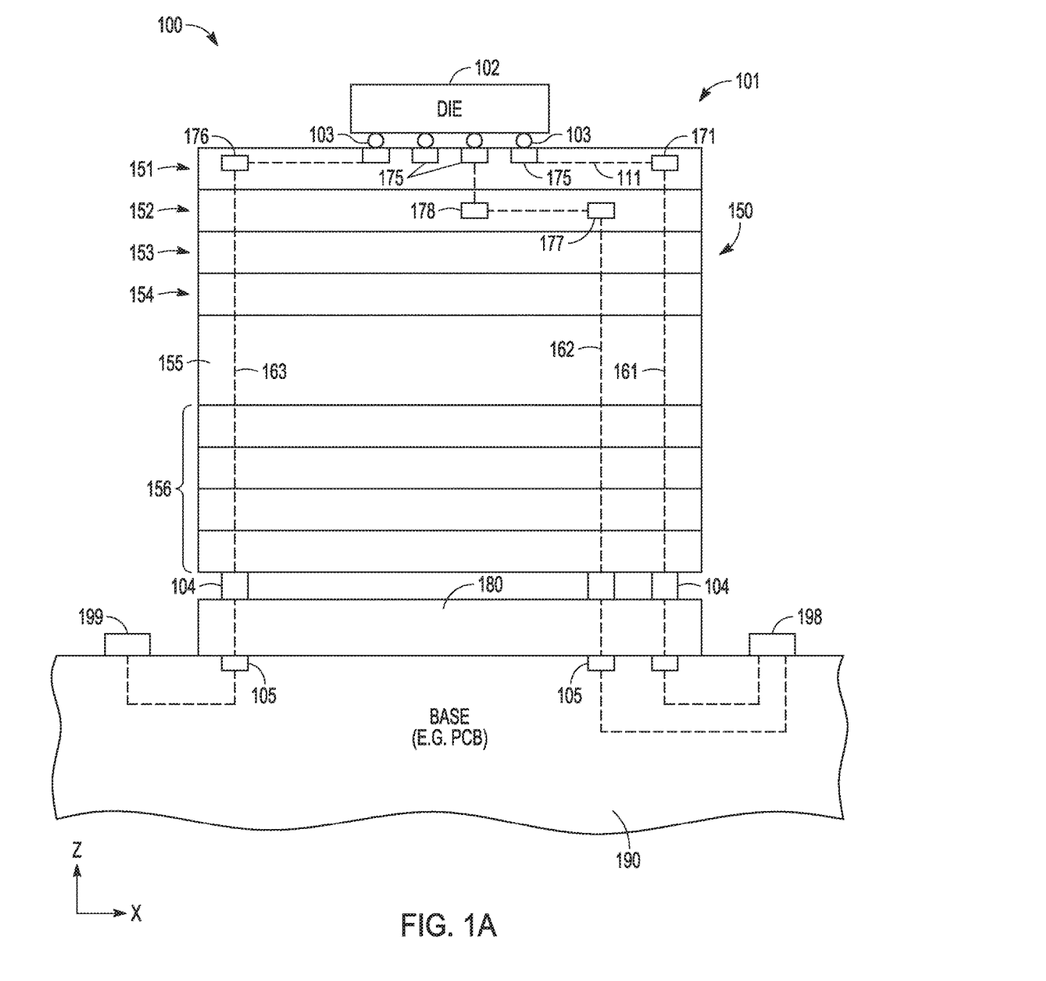
FIG. 1A shows a cross section of an apparatus in the form of an electronic equipment including a package coupled to a base, according to some embodiments described herein.

FIG. 1A shows a cross section of an apparatus in the form of an electronic equipment 100 including a package 101 coupled to a base 190, according to some embodiments described herein. Electronic equipment 100 may include or be included in electronic items such as laptop computers, desktop computers, tablets, e-book readers, personal digital assistants (PDAs), cellular telephones, smart phones, servers, web appliances, set-top boxes (STBs), network routers, network switches, network bridges, or other types of devices or equipments.

Package 101 in FIG. 1A may include a ball grid array (BGA) packaging type, land grid array (LGA) packaging type, pin grid array (PGA) packaging type, or other types of packaging. Base 190 may include a circuit board, such as a printed circuit board (PCB). Base 190 may include components (e.g., components 198 and 199) such as capacitors, resistors, transistors, integrated circuit chips, or other electrical components coupled to it or formed thereon.

Package 101 may include a die 102 and a substrate 150. Die 102 may include a semiconductor (e.g., silicon) die. Die 102 may include circuitry (not shown in FIG. 1A) that may form part of a device (or devices) to perform one or more functions, such as processing information, storing information, or other functions. For example, die 102 may include a processor (e.g., including transistors, arithmetic logic units, and other components) that may include a central processing unit (CPU), a graphics processing unit (GPU), or both. The processor may also include application specific integrated circuits (ASIC).

Die 102 in FIG. 1A may include electrical connections 103 coupled to respective pads 175 of substrate 150. Pads 175 include electrically conductive materials (e.g., materials including metals).

Substrate 150 may include an IC package substrate, which may include an organic substrate, ceramic substrate, or other types of substrates. Substrate 150 may include no active components (e.g., no transistors). Substrate 150 may be coupled to base 190 through electrical connections 104 and 105 and a structure 180. Structure 180 may include a socket (e.g., a socket attached to a motherboard) or other types of structural connections. In some cases, structure 180 may be omitted, such that electrical connections 104 from substrate 150 may be directly coupled to electrical connections 105 on base 190. Electrical connections 103, 104, and 105 may include electrically conductive materials, such as solder balls, pads, lands, pins, or other types of electrical connections.

Substrate 150 may include different layers, such as layers 151, 152, 153, 154, and 156, and a core 155. In some arrangements, substrate 150 may include a coreless substrate, such that core 155 may be omitted from substrate 150.

As shown in FIG. 1A, layers 151, 152, 153, and 154 may be arranged (e.g., stacked on top of each other) in a z-direction (e.g., a vertical direction). The z-direction may extend in a direction along the thickness of substrate 150 and perpendicularly to base 190. FIG. 1A also shows an x-direction (e.g., a horizontal direction), which is perpendicular to the z-direction. FIG. 1A shows an example of four layers (e.g., 151, 152, 153, and 154) above core 155 and four layers (e.g., 156) below core 155 as an example. The number of layers above and below core 155 may vary.

Substrate 150 may include internal conductive paths, such as conductive paths 161, 162, and 163 to provide electrical communication between die 102 and other components of electronic equipment 100 (e.g., components coupled to base 190). For example, as shown in FIG. 1A, conductive paths 161 and 162 may be arranged to provide electrical communication between die 102 and component 198. Conductive path 163 may be arranged to provide electrical communication between die 102 and component 199.

Each of conductive paths 161, 162, and 163 may include one or more portions extending in the x-direction (in one of layers 151, 152, 153, 154, and 156) and one or more portions extending in the z-direction (e.g., extending from one layer to another layer and through core 155). FIG. 1A shows only three conductive paths 161, 162, and 163 in substrate 150 as an example. The number of conductive paths may vary. For example, substrate 150 may have hundreds or more of conductive paths similar to conductive paths 161, 162, and 163.

Each of conductive paths (e.g., 161, 162, and 163) in substrate 150 may include a combination of conductive elements located in one or more layers of substrate 150. The conductive elements may include traces (e.g., trace 111), pads (e.g., one or more of pads 171, 175, 176, 177, and 178), vias (e.g., microvias filled with conductive materials, not shown in FIG. 1A), conductive holes (e.g., plated through holes, not shown in FIG. 1A), and other conductive elements. For example, as shown in FIG. 1A, trace 111 may be part of conductive path 161 located in level 151.

Figure 1B:
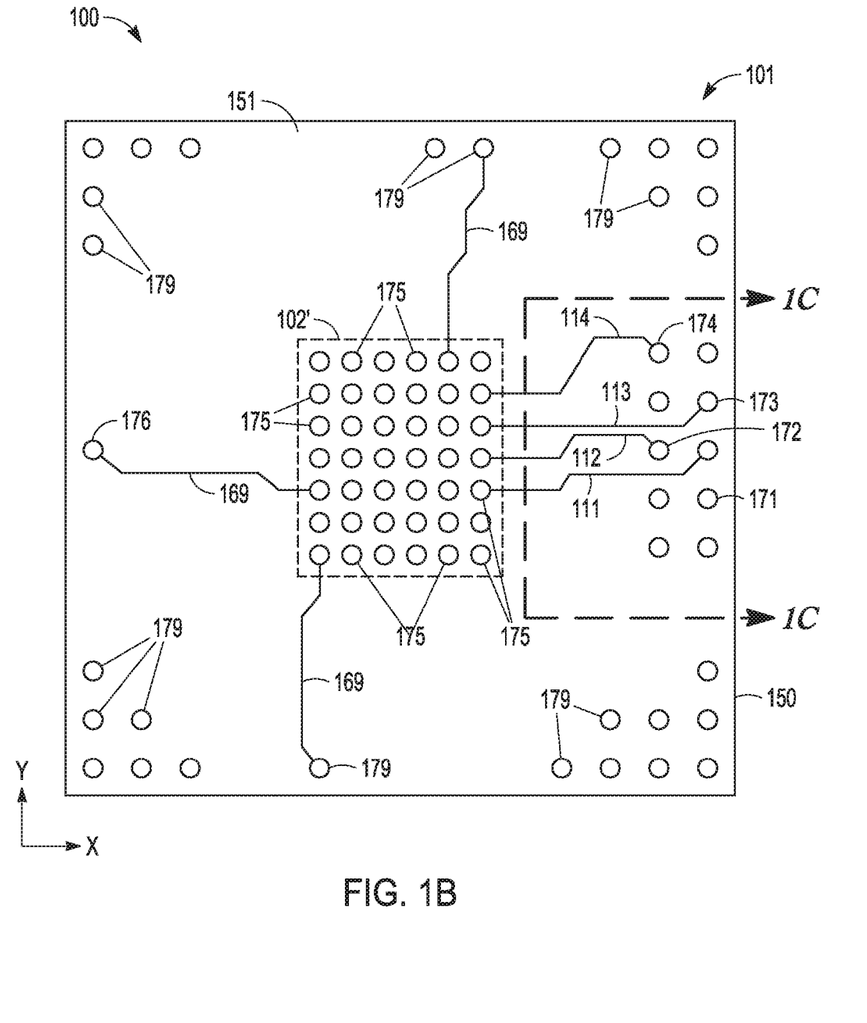
FIG. 1B shows a top view of the package of FIG. 1A including traces in a layer of a substrate of the package, according to some embodiments described herein.

FIG. 1B shows a top view of package 101 of FIG. 1A including traces 111, 112, 113, and 114 in layer 151 (e.g., top layer) of substrate 150, according to some embodiments described herein. Die 102 (FIG. 1A) is not shown in FIG. 1B. However, die 102 may occupy a footprint 102' on an x-y plane (with respect to the x-direction and a y-direction perpendicular to the x-direction). The dimension (e.g., perimeter) of footprint 102' may correspond to (or substantially correspond to) the perimeter defined by the edges of die 102.

As shown in FIG. 1B, substrate 150 may include pads (e.g., pads 171, 172, 173, 174, and 176) located outside footprint 102' in layer 151 and other pads (e.g., pads 175) located inside footprint 102' in layer 151. For simplicity, only some of the pads (e.g., 171, 172, 173, 174, and 175) of substrate 150 are labeled. Pads 175 inside footprint 102' may be coupled (e.g., directly coupled) to die 102 (FIG. 1A) through electrical connections 103 (FIG. 1A) by, for example, solder bonding or by other techniques.

As shown in FIG. 1B, traces 111, 112, 113, and 114 may include portions that are parallel among each other in the x-y plane (e.g., portions that are located side-by-side in the same x-y plane). Traces 111, 112, 113, and 114 may be coupled to some pads (e.g., some of pads 175) inside footprint 102' and to some pads (e.g., pads 171, 172, 173, and 174) outside footprint 102'. Layer 151 may also include many other traces (e.g., traces 169) and pads (e.g., pads 179) associated with other conductive paths in substrate 150 (FIG. 1A). For simplicity, only some of the other traces (e.g., traces 169) and some of the other pads (e.g., pads 179) in layer 151 are shown in FIG. 1B.

Other layers under layer 151 (e.g., 152, 153, and 154 in FIG. 1A) of substrate 150 may include traces (e.g., similar to traces 111, 112, 113, 114, and 169 in layer 151) coupled to corresponding pads (e.g., 177 and 178 in FIG. 1A, not shown in FIG. 1B) in those layers.

Figure 1C:
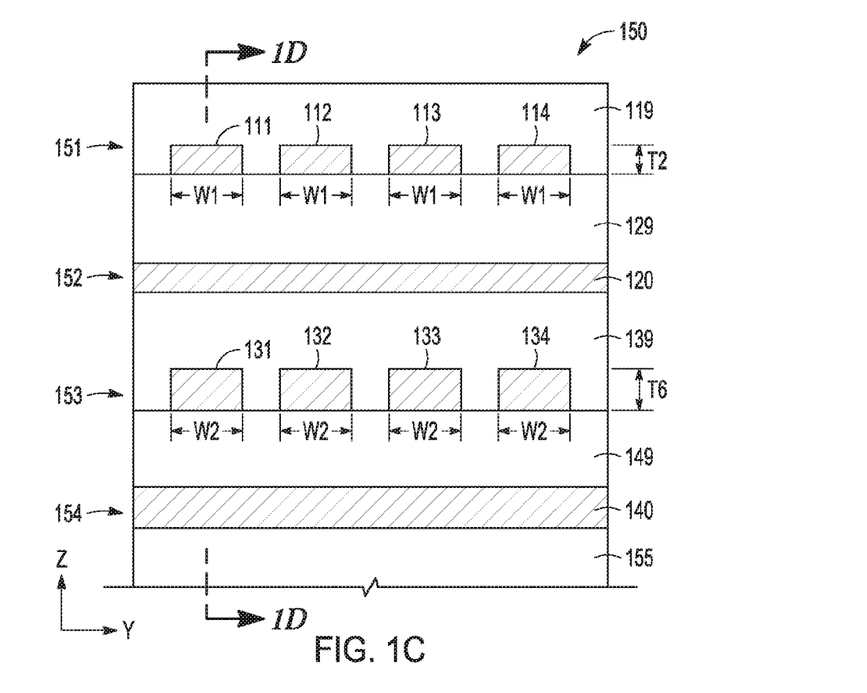
FIG. 1C shows a y-z cross section of a portion of the substrate of FIG. 1B including traces in the same layer having the same thickness and traces in different layers having different thicknesses, according to some embodiments described herein.
Figure 1D:
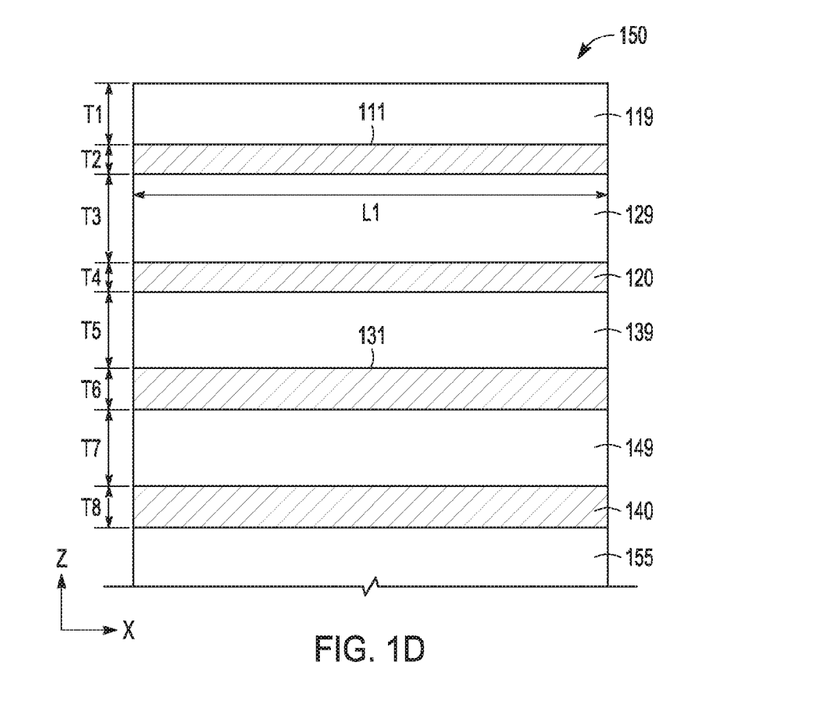
FIG. 1D shows an x-z cross section of the portion of the substrate of FIG. 1C, according to some embodiments described herein.

FIG. 1C shows a cross section of a portion of substrate 150 along section line 1C-1C of FIG. 1B, according to some embodiments described herein. FIG. 1D shows a cross section of a portion of the substrate 150 along section line 1D-1D of FIG. 1C, according to some embodiments described herein. As shown in FIGS. 1C and 1D, besides traces 111, 112, 113, and 114 in layer 151, substrate 150 may include other traces, such as traces 131, 132, 133, and 134 in layer 153. Traces 111, 112, 113, and 114 may be the top-most electrically conductive traces in substrate 150 (e.g., traces located in the top layer of substrate 150 above all other traces, such as traces 131, 132, 133, and 134). Traces 131, 132, 133, and 134 may be coupled to pads similar pads of substrate 150 (e.g., pads similar to pads 175, 177, and 178 of FIG. 1A)

As shown in FIG. 1C and FIG. 1D, each of traces 111, 112, 113, 114, 131, 132, 133, and 134 has a thickness in the z-direction, a width in the y-direction, and a length in the x-direction. For example, trace 111 has a thickness T2 in the z-direction, a width W1 in the y-direction, and a length L1 in the x-direction.

FIG. 1C shows an example of a routing arrangement where traces in the same layer (e.g., traces located side-by-side on the same level in the z-direction) may have the same thickness (same thickness value). For example, traces 111, 112, 113, and 114 in layer 151 may have the same thickness T2. Traces 131, 132, 133, and 134 may have the same thickness T6. Traces between different layers may have different thicknesses (thicknesses having different thickness values). Thus, thickness T2 and T6 may be different from each other. For example, thickness T6 may be greater than thickness T2. Alternatively, thickness T6 may be less than thickness T2.

Traces in the same layer (e.g., layer 151) may have the same width (widths having an equal value). For example, traces 111, 112, 113, and 114 may have a same width W1. Traces 131, 132, 133, and 134 may have a same width W2. In an alternative arrangement, traces in the same layer (e.g., layer 151 or layer 153) may have different widths (widths having unequal values). For example, two or more of traces 111, 112, 113, and 114 may have different widths. Two or more of traces 131, 132, 133, and 134 may have different widths.

Traces in different layers (e.g., layer 151 and 153) may have the same width or different widths. For example, width W1 may be the same as width W2. In another example, width W1 may be different from width W2 (e.g., width W2 may be greater than width W1).

Traces 111, 112, 113, 114, 131, 132, 133, and 134 may be part of conductive paths (e.g., similar to conductive paths

161, 162, and 163) to carry information (e.g., in the form of signals, such as input/output (I/O) signals) between die 102 (FIG. 1A) and other components (e.g., similar to components 198 and 199 in FIG. 1A). The information may include data information, address information, control information, or other information.

As shown in FIG. 1C and FIG. 1D, substrate 150 may include planes 120 and 140 located in layers 152 and 154, respectively. Planes 120 and 140 may include power delivery planes to carry supply power (e.g., power and ground signals). For example, each of planes 120 and 140 may include a power plane to carry power (e.g., Vcc) or a ground plane to carry ground (e.g., Vss). The power (e.g., power signal) and ground (e.g., ground signal) may be delivered to die 102 (FIG. 1A) through conductive paths in substrate 150 (e.g., conducive paths 161, 162, and 163 in FIG. 1A).

As shown in FIG. 1C and FIG. 1D, planes 120 and 140 have thicknesses T4 and T8, respectively. Thicknesses T4 and T8 may be the same thickness or different thicknesses. Both thicknesses T4 and T8 may be different from thickness T2 or thickness T6.

Traces 111, 112, 113, 114, 131, 132, 133, and 134, and planes 120 and 140 may include electrically conductive materials, such as metals (e.g., copper). Traces 111, 112, 113, 114, 131, 132, 133, and 134 may include strip-lines and micro-strips. For example, traces 111, 112, 113, and 114 may include micro-strips. Traces 131, 132, 133, and 134 may include strip-lines.

As shown in FIG. 1C and FIG. 1D, substrate 150 may include dielectrics 119, 129, 139, and 149. Dielectric 119 may be formed over traces 111, 112, 113, and 114 and may directly contact traces 111, 112, 113, and 114 (e.g., directly contact the top and two sides of each of traces 111, 112, 113, and 114).

Dielectric 129 may be formed over plane 120 and may be located between plane 120 and traces 111, 112, 113, and 114. Dielectric 129 may directly contact plane 120 (e.g., directly contact the top of plane 120) and directly contact traces 111, 112, 113, and 114 (e.g., directly contact the bottom of each of traces 111, 112, 113, and 114).

Dielectric 139 may be formed over traces 131, 132, 133, and 134 and may directly contact traces 131, 132, 133, and 134 (e.g., directly contact the top and two sides of each of traces 131, 132, 133, and 134).

Dielectric 149 may be formed over plane 140 and may be located between plane 140 and traces 131, 132, 133, and 134. Dielectric 129 may directly contact plane 140 (e.g., directly contact the top of plane 140) and directly contact traces 131, 132, 133, and 134 (e.g., directly contact the bottom of each of traces 131, 132, 133, and 134).

Dielectrics 119, 129, 139, and 149 have thicknesses T1, T3, T5, and T7, respectively. Thicknesses T1, T3, T5, and T7 may be the same thickness. Alternatively, thicknesses T1, T3, T5, and T7 may be different from each other. For example, thickness T7 may be greater than thickness T5, and thickness T5 may be greater than thickness T3.

FIG. 1C shows four traces 111, 112, 113, and 114 in layer 151 and four traces 131, 132, 133, and 134 in layer 153 as an example. The number of traces in each of layers 151 and 153 may vary.

In substrate 150, traces in the same layer may be arranged to form a group (e.g., a bus) or may be part a group to carry signals. For example, traces 111, 112, 113, and 114 in layer 151 may be arranged to form a group or may be part a group (e.g., a group including other traces besides traces 111, 112, 113, and 114). Traces 131, 132, 133, and 134 in layer 153 may be arranged to form another group or may be part another group (e.g., a group including other traces besides traces 131, 132, 133, and 134).

The signals carried by the traces of different layers may have the same types or different types. For example, traces 111, 112, 113, and 114 in layer 151 may be part of a memory bus arranged to carry single-ended signals. Traces 131, 132, 133, and 134 in layer 151 may be part of a serial bus arranged to carry differential signals. In some arrangements, the signals carried by traces 111, 112, 113, 114, 131, 132, 133, and 134 may represent information (e.g., data) being transferred at a transfer rate in the range from 2 giga-transfers per second (GT/s) to 40 GT/s. For example, each of traces 111, 112, 113, and 114 in layer 151 may be arranged to carry a single-ended signal corresponding to a transfer rate of 2.4 GT/s, 3.3 GT/s, or other transfer rates (e.g., less than 10 GT/s). In another example, each of traces 131, 132, 133, and 134 in layer 153 may be arranged to carry a component of differential signal corresponding to a transfer rate of 10 GT/s or higher.

Different types of signals may be more susceptible to different undesirable conditions under the constraints of some design rules and manufacturing conditions. For example, single-ended signals may be susceptible to crosstalk. Differential signals may be susceptible to signal loss (e.g., differential loss). Crosstalk and signal loss may reduce the integrity of the signals. In some conventional routing arrangements, conditions such as crosstalk and signal loss may occur if the traces are improperly arranged. Further, control of such conditions in some conventional routing arrangements may be difficult if all traces in the substrate have a uniform thickness and all dielectrics in the substrate have a uniform thickness.

In substrate 150, having traces in different layers with non-uniform thicknesses (e.g., thicknesses T2 and T6 shown in FIG. 1C) and dielectrics with non-uniform thicknesses (e.g., thicknesses T1 and T5 shown in FIG. 1D) may allow for controlling of conditions such as crosstalk and signal loss and maintaining and/or improving the integrity of signals in substrate 150. For example, if traces 111, 112, 113, and 114 in layer 151 (FIG. 1C) are arranged to carry single-ended signals, the thickness of traces 111, 112, 113, and 114 may be appropriately selected (e.g., thicknesses T2 shown in FIG. 1C) and the thicknesses of dielectric 119 and 129 may be selected to be relatively small (e.g., thicknesses T1 and T3 shown in FIG. 1D) to control (e.g., reduce) crosstalk that may occur in the single-ended signals. In another example, if traces 131, 132, 133, and 134 in layer 153 (FIG. 1C) are arranged to carry differential signals, the thicknesses of traces 131, 132, 133, and 134 may be selected to be relatively large (e.g., thickness T6 as shown in FIG. 1C) and the thicknesses of dielectric 139 and 149 may be selected to be relatively large (e.g., thicknesses T5 and T7 shown in FIG. 1D) to control (e.g., reduce) signal loss that may occur in the differential signals.

Figure 2A:
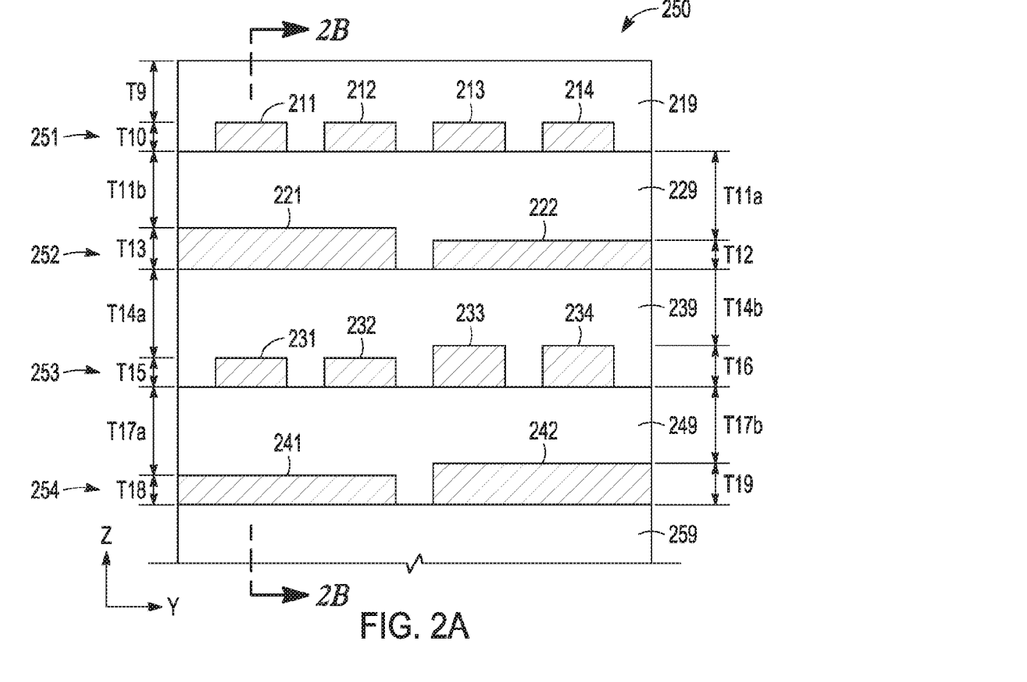
FIG. 2A and FIG. 2B show cross sections of a portion of a substrate including traces in the same layer having different thicknesses, according to some embodiments described herein.
Figure 2B:
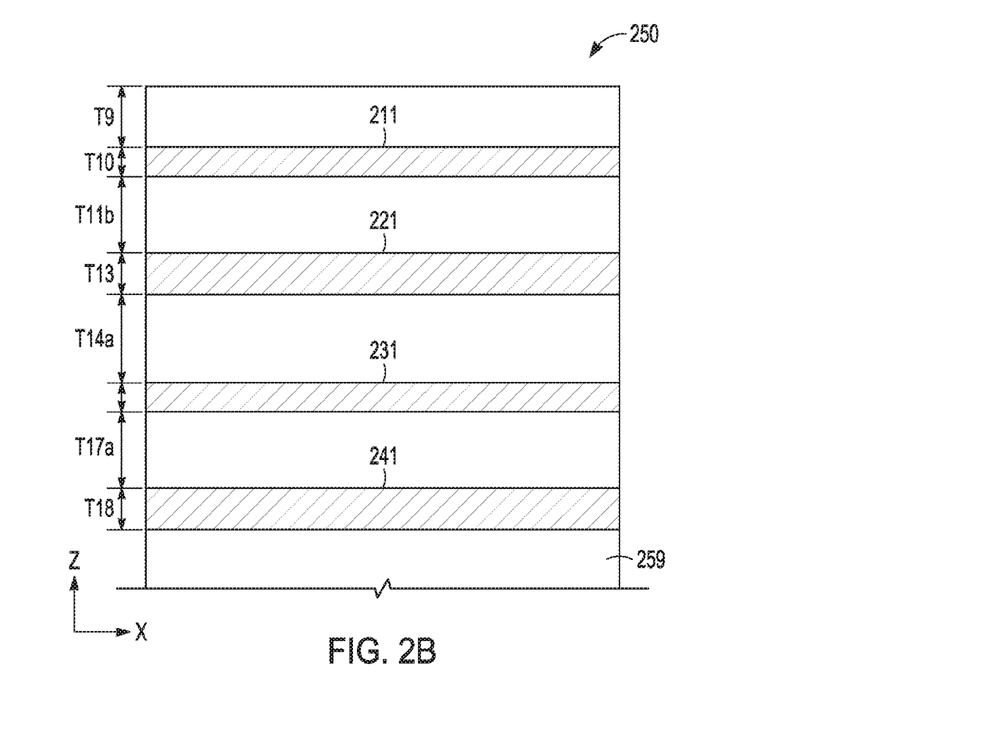

FIG. 2A and FIG. 2B show cross sections of a portion of a substrate 250, according to some embodiments described herein. Substrate 250 may be an alternative for substrate 150 of FIG. 1A through FIG. 1D. Thus, substrate 250 may be substituted for substrate 150 in package 101 (FIG. 1A and FIG. 1B).

As described above with reference to FIG. 1A through FIG. 1D, traces in the same layer (e.g., either layer 151 or layer 153 in FIG. 1C) in substrate 150 may have the same thickness. FIG. 2A and FIG. 2B shows an example of a routing arrangement where traces in at least one layer (e.g., layer 253) of substrate 250 may have different thicknesses.

Although not shown in FIG. 2A and FIG. 2B, substrate 250 may include elements similar to or identical to those of substrate 150 shown in FIG. 1A and FIG. 1B, such as conductive paths formed by conductive elements that may include traces, pads, vias, conductive holes, and other conductive elements, described above with reference to FIG. 1A through FIG. 1D.

The portions of substrate 250 in FIG. 2A and FIG. 2B may correspond to the portions of substrate 150 of FIG. 1C and FIG. 1D, respectively. For example, as shown in FIG. 2A and FIG. 2B, substrate 250 may include layers 251, 252, 253, and 254, which may correspond to layers 151, 152, 153, and 154, respectively, of substrate 150 of FIG. 1A through FIG. 1D.

As shown in FIG. 2A and FIG. 2B, substrate 250 may include traces 211, 212, 213, and 214 in layer 251, and traces 231, 232, 233, and 234 in layer 253. Traces 211, 212, 213, and 214 may be the top-most electrically conductive traces in substrate 250 (e.g., traces located in the top layer of substrate 250 above all other traces, such as traces 231, 232, 233, and 234). Traces 211, 212, 213, and 214 may have the same thickness T10.

Traces 231, 232, 233, and 234 in layer 253 may have different thicknesses T15 and T16. For example, traces 231 and 232 in layer 253 may have the same thickness T15. Traces 233 and 234 in layer 253 may have the same thickness T16. Thickness T16 may be greater than thickness T15.

Traces 211, 212, 213, and 214 in layer 251 and traces 231, 232, 233, and 234 in layer 253 may include electrically conductive materials, such as metals (e.g., copper). Traces 211, 212, 213, 214, 231, 232, 233, and 234 may include strip-lines and micro-strips. For example, traces 211, 212, 213, and 214 may include micro-strips. Traces 231, 232, 233, and 234 may include strip-lines.

Substrate 250 may include planes (e.g., power delivery planes) 221 and 222 that may be separated (e.g., electrically isolated) from each other. As shown in FIG. 2A and FIG. 2B, planes 221 and 222 may be located in the same layer 252. Planes 221 and 222 may be arranged to carry any combination of supply power (e.g., power signal) and ground (e.g., ground signal). For example, both planes 221 and 222 may be arranged to carry power (e.g., Vcc). In another example, both planes 221 and 222 may be arranged to carry ground (e.g., Vss). In a further example, one of planes 221 and 222 may be arranged to carry power and the other plane may be arranged to carry ground. In an alternative arrangement, planes 221 and 222 may be replaced by a single power delivery plane in the same layer 252. For example, planes 221 and 222 may be replaced by a single power plane in layer 253 to carry power (e.g., Vcc). In another example, planes 221 and 222 may be replaced by a single ground plane in layer 252 to carry ground (e.g., Vss). Plane 221 may have a thickness T13. Plane 221 may have a thickness T12. Thicknesses T12 and T13 may be different from each other. For example, thickness T13 may be greater than thickness T12.

Substrate 250 may include planes (e.g., power delivery planes) 241 and 242 that may be separated (e.g., electrically isolated) from each other. As shown in FIG. 2A and FIG. 2B, planes 241 and 242 may be located in the same layer 254. Planes 241 and 242 may be arranged to carry any combination of supply power and ground (e.g., power and ground signals). For example, both planes 241 and 242 may be arranged to carry power (e.g., Vcc). In another example, both planes 241 and 242 may be arranged to carry ground (e.g., Vss). In a further example, one of planes 241 and 242 may be arranged to carry power, and the other plane may be arranged to carry ground. In an alternative arrangement, planes 241 and 242 may be replaced by a single power delivery plan in the same layer 253. For example, planes 241 and 242 may be replaced by a single power plane in layer 253 to carry power (e.g., Vcc). In another example, planes 241 and 242 may be replaced by a single ground plane in layer 253 to carry ground (e.g., Vss). Plane 241 may have a thickness T18. Plane 242 may have a thickness T19. Thicknesses T18 and T19 may be different from each other. For example, thickness T19 may be greater than thickness T18.

In some arrangements, planes 221, 222, 241, and 242 may be selected to carry specific combinations of power and ground depending on signals carried by traces in one or both of layers 251 and 253. For example, planes 222 and 242 may be arranged to carry power and ground, respectively, if traces 233 and 234 are arranged to carry differential signals.

As shown in FIG. 2A, substrate 250 may include dielectrics 219, 229, 239, and 249. Dielectric 219 may be formed over traces 211, 212, 213, and 214 and may directly contact traces 211, 212, 213, and 214 (e.g., directly contact the top and two sides of each of traces 211, 212, 213, and 214).

Dielectric 229 may be formed over planes 221 and 222 and may be located between planes 221 and 222 and traces 211, 212, 213, and 214. Dielectric 229 may directly contacts planes 221 and 222 (e.g., directly contact the top of each of planes 221 and 222) and directly contact traces 211, 212, 213, and 214 (e.g., directly contact the bottom of each of traces 211, 212, 213, and 214).

Dielectric 239 may be formed over traces 231, 232, 233, and 234 and may directly contact traces 231, 232, 233, and 234 (e.g., directly contact the top and two sides of each of traces 231, 232, 233, and 234).

Dielectric 249 may be formed over planes 241 and 242 and may be located between planes 241 and 242 and traces 231, 232, 233, and 234. Dielectric 249 may directly contact planes 241 and 242 (e.g., directly contact the top of each of planes 241 and 242) and directly contact traces 231, 232, 233, and 234 (e.g., directly contact the bottom of each of traces 231, 232, 233, and 234).

Dielectric 219 has the same thickness T9 over traces 211, 212, 213, and 214. Each of dielectrics 229, 239, and 249 may have different thickness in different portions of the dielectric because each of dielectrics 229, 239, and 249 may be formed over traces (or over power delivery planes) that have different thicknesses. For example, dielectric 229 may have thickness T11a (over plane 222) and thickness T11b (over plane 221) where thickness T11b may be greater than thickness T11a. Dielectric 239 may have thickness T14a (over traces 231 and 232) and thickness T14b (over traces 233 and 234) where thickness T14b may be greater than thickness T14a. Dielectric 249 may have thickness T17a (over plan 241) and thickness T17b (over plane 242) where thickness T17b may be greater than thickness T17a.

FIG. 2A shows four traces 211, 212, 213, and 214 in layer 251 and four traces 231, 232, 233, and 234 in layer 253 as an example. The number of traces in each of layers 251 and 253 may vary.

In substrate 250, traces in the same layer may be arranged to form a group (e.g., a bus) of traces or may be part a group of traces to carry signals. For example, traces 211, 212, 213, and 214 in layer 251 may be arranged to form a group or may be part a group (e.g., a group including other traces besides traces 211, 212, 213, and 214). Traces 231, 232, 233, and 234 in layer 253 may be arranged to form another group or may be part another group (e.g., a group including other traces besides traces 231, 232, 233, and 234).

Traces in the same layer may also be arranged to form multiple groups or may be part of multiple groups to carry signals (e.g., signals having different types). Thus, traces 231, 232, 233, and 234 in layer 253 may be arranged to form more than one group or may be part of more than one group. For example, traces 231 and 232 may be part of a group of traces to carry single-ended signals, and traces 233 and 234 may be part of another group of traces to carry differential signals. Each of traces 211, 212, 213, 214, 231, 232, 233, and 234 may be arranged to carry signals corresponding to a transfer rate (e.g., data transfer rate) in the range of giga-transfers per second.

In substrate 250, having traces with non-uniform thicknesses (e.g., thicknesses T15 and T16 shown in FIG. 2A) and dielectrics with non-uniform thicknesses (e.g., thicknesses T9 and T14a (or T14b) shown in FIG. 2A) may allow different traces to be used to carry different types (single-ended and differential signals). For example, if traces 231 and 232 (FIG. 2A) are arranged (e.g., arranged as part of a memory bus) to carry single-ended signals and traces 233 and 234 are arranged (e.g., arranges as part of a serial bus) to carry components of differential signals, then the thickness of dielectric above trace 241 may be selected to be relatively small (e.g., thickness T17a as shown in FIG. 2A) and the thickness of dielectric above trace 242 may be selected to be relatively large (e.g., thickness T17b as shown in FIG. 2A). Having traces with non-uniform thicknesses in the same layer and dielectric with non-uniform thicknesses, may allow for controlling (e.g., reduce) crosstalk (that may occur to the signals carried by traces 231 and 232) and signal loss (that may occur to the signals carried by traces 233 and 234).

The descriptions above with respect to FIG. 1A through FIG. 2B show examples where the top-most electrically conductive traces of substrate 150 (e.g., traces 111, 112, 113, and 114 in FIG. 1C) may have the same thickness (e.g., T2) and the top-most electrically conductive traces of substrate 250 (e.g., traces 211, 212, 213, and 214 in FIG. 2A) may have the same thickness (e.g., T10). Alternatively, the top-most electrically conductive traces of substrate 150 or substrate 250 may have different thickness.

Figure 3:
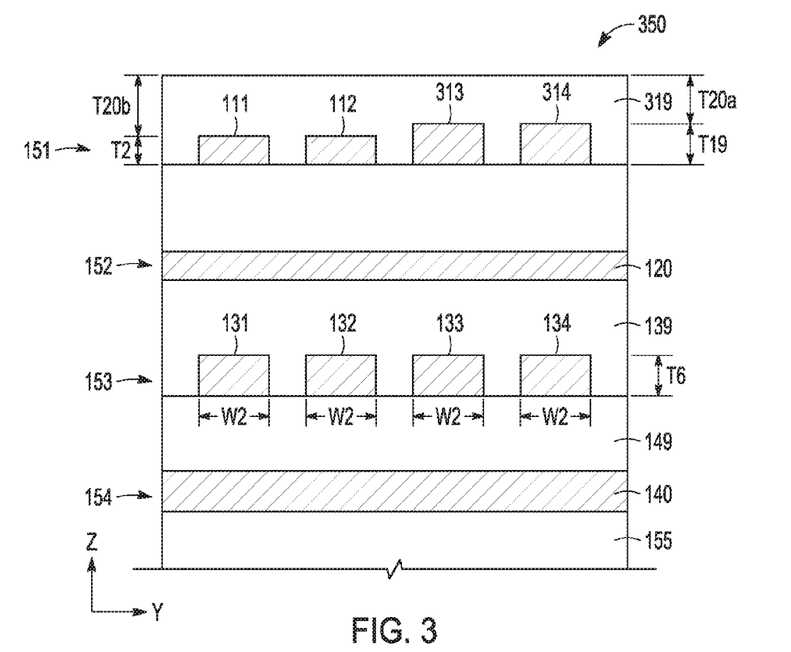
FIG. 3 shows a cross section of a portion of a substrate (which may be an alternative for the substrate of FIG. 1C) including traces in a top layer having different thicknesses, according to some embodiments described herein.

FIG. 3 shows a cross section of a portion of a substrate 350 including traces (e.g., at least two of traces 111, 112, 313, and 314) having different thicknesses, according to some embodiments described herein. Traces 111, 112, 313, and 314 may be the top-most electrically conductive traces of substrate 350. Traces 111, 112, 313, and 314 may include micro-strips. Substrate 350 may be an alternative for substrate 150 of FIG. 1A through FIG. 1D. Thus, substrate 350 may be substituted for substrate 150 in package 101 (FIG. 1A and FIG. 1B). Substrate 350 (FIG. 3) may include elements similar to or identical to those of substrate 150 shown in FIG. 1A through FIG. 1D. Thus, similar or identical elements between substrates 150 and 350 are given the same reference designations. The description of similar or identical elements between substrates 150 and 350 is not repeated in the description of substrate 350 of FIG. 3.

Differences between substrates 150 and 350 include the difference in thicknesses in at least two of traces 111, 112, 313, and 314 in layer 151 in substrate 350. For example, traces 313 and 314 may have a thickness T19, which is different from thickness T2 of traces 111 and 112. Thickness T19 may be greater than thickness T2. In comparison with substrate 150 (FIG. 1C), traces 111, 112, 113, and 114 in FIG. 1C may have the same thickness (e.g., T2).

Substrate 350 may include a dielectric 319 formed over traces 111, 112, 313, and 314. Dielectric 319 may directly contact traces 111, 112, 313, and 314 (e.g., directly contact the top and two sides of each of traces 111, 112, 313, and 314). Dielectric 319 may have different thickness in different portions of the dielectric because it may be formed over traces 111, 112, 313, and 314, which have different thicknesses. For example, dielectric 319 may have thickness T20a (over traces 313 and 314) and thickness T20b (over traces 111 and 112). Thickness T20b may be greater than thickness T20a.

Figure 4:
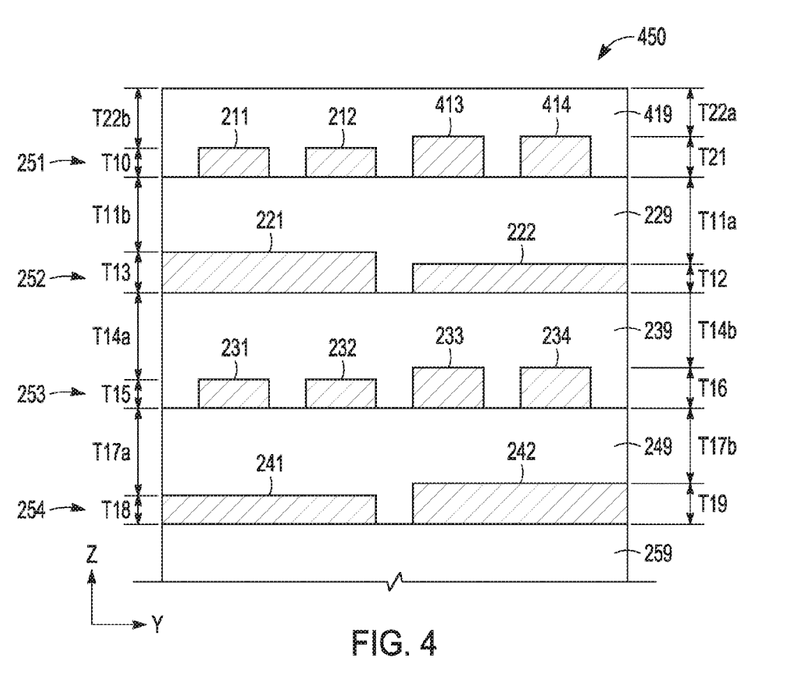
FIG. 4 shows a cross section of a portion of a substrate (which may be an alternative for the substrate of FIG. 2A) including traces in a top layer having different thicknesses, according to some embodiments described herein.

FIG. 4 shows a cross section of a portion of a substrate 450 including traces 211, 212, 413, and 414 having different thicknesses, according to some embodiments described herein. Traces 211, 212, 413, and 414 may be the top-most electrically conductive traces of substrate 450. Traces 211, 212, 413, and 414 may include micro-strips. Substrate 450 may be an alternative for substrate 250 of FIG. 2A. Thus, substrate 450 may be substituted for substrate 150 in package 101 (FIG. 1A and FIG. 1B). Substrate 450 (FIG. 4) may include elements similar to or identical to those of substrate 250 shown in FIG. 2A. Similar or identical elements between substrates 250 and 450 are given the same reference numbers. For simplicity, the description of similar or identical elements between substrates 250 and 450 is not described in the description of substrate 450 in FIG. 4.

Differences between substrates 250 and 450 include the difference in thicknesses in at least two of traces 211, 212, 413, and 414 in layer 251 in substrate 450. For example, traces 413 and 414 may have a thickness T21, which is different from thickness T10 of traces 211 and 212. Thickness T21 may be greater than thickness T10. In comparison with substrate 250 (FIG. 2C), traces 211, 212, 213, and 214 in FIG. 2C may have the same thickness (e.g., T10).

Substrate 450 may include a dielectric 419 formed over traces 211, 212, 413, and 414. Dielectric 419 may directly contact traces 211, 212, 413, and 414 (e.g., directly contact the top and two sides of each of traces 211, 212, 413, and 414). Dielectric 419 may have different thicknesses in different portions of the dielectric because it may be formed over traces 211, 212, 413, and 414, which have different thicknesses. For example, dielectric 419 may have thickness T22a (over traces 413 and 414) and thickness T22b (over traces 211 and 212). Thickness T22b may be greater than thickness T22a.

Figure 5:
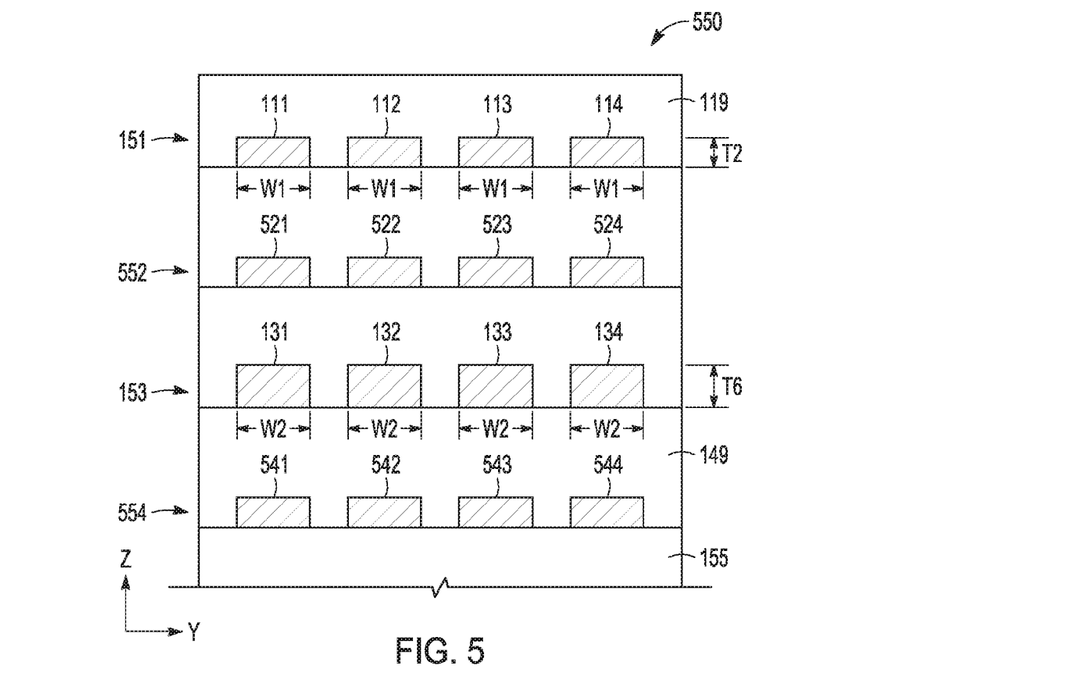
FIG. 5 shows a cross section of a portion of a substrate (which may be an alternative for the substrate of FIG. 1C) including separate traces arranged to carry at least one of power and ground, according to some embodiments described herein.

FIG. 5 shows a cross section of a portion of a substrate 550 including traces 521, 522, 523, and 524 and traces 541, 542, 543, and 544 arranged to carry at least one of power and ground, according to some embodiments described herein. Substrate 550 may be an alternative for substrate 150 of FIG. 1C. Substrate 550 may be substituted for substrate 150 in package 101 (FIG. 1A and FIG. 1B). Substrate 550 (FIG. 5) may include elements similar to or identical to those of substrate 150 shown in FIG. 1C. Similar or identical elements between substrates 150 and 550 are given the same reference numbers. For simplicity, the description of similar or identical elements between substrates 150 and 550 is not described in the description of substrate 550 in FIG. 5.

Differences between substrate 550 (FIG. 5) and substrate 150 (FIG. 1C) include differences between elements in layer 152 in substrate 150 and layer 552 in substrate 550. For example, in FIG. 1C, layer 152 of substrate 150 may include a single plane (e.g., power delivery plane) 120 arranged to carry power or ground. In FIG. 5, in layer 552 of substrate 550, traces 521, 522, 523, and 524 may be separated (e.g., electrically isolated) from each other. Traces 521, 522, 523, and 524 may be arranged to carry power, ground, or both.

Differences between substrate 550 (FIG. 5) and substrate 150 (FIG. 1C) also include differences between elements in layer 154 in substrate 150 and layer 554 in substrate 550. For example, in FIG. 1C, layer 154 of substrate 150 may include a single plane (e.g., power delivery plane) 140 arranged to carry power or ground. In FIG. 5, in layer 554 of substrate 550, traces 541, 542, 543, and 544 may be separated (e.g., electrically isolated) from each other. Traces 541, 542, 543, and 544 may be arranged to carry power, ground, or both.

Figure 6:
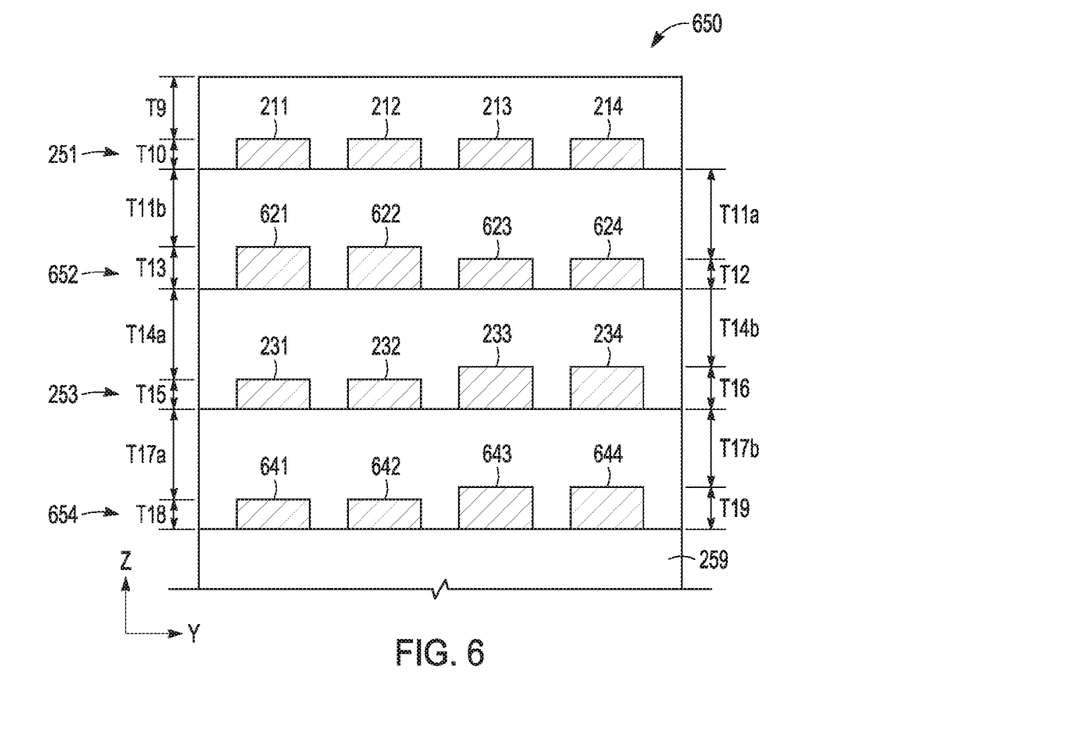
FIG. 6 shows a cross section of a portion of a substrate (which may be an alternative for the substrate of FIG. 2A) including separate traces arranged to carry at least one of power and ground, according to some embodiments described herein.

FIG. 6 shows a cross section of a portion of a substrate 650 including traces 621, 622, 623, and 624 and traces 641, 642, 643, and 644 arranged to carry at least one of power and ground, according to some embodiments described herein. Substrate 650 may be an alternative for substrate 250 of FIG. 2A. Substrate 650 may be substituted for substrate 150 in package 101 (FIG. 1A and FIG. 1B). Substrate 650 (FIG. 6) may include elements similar to or identical to those of substrate 250 shown in FIG. 2A. Similar or identical elements between substrates 250 and 650 are given the same reference numbers. For simplicity, the description of similar or identical elements between substrates 250 and 650 is not described in the description of substrate 650 in FIG. 6.

Differences between substrate 650 (FIG. 6) and substrate 250 (FIG. 2A) include differences between elements in layer 252 in substrate 250 and layer 652 in substrate 650. For example, in FIG. 2A, layer 252 of substrate 250 may include planes 221 and 222 (e.g., power delivery planes) arranged to carry power, ground, or both. In FIG. 6, in layer 652 of substrate 650, traces 621, 622, 623, and 624 may be separated (e.g., electrically isolated) from each other. Traces 621, 622, 623, and 624 may be arranged to carry power, ground, or both. For example, traces 621 and 622 may be arranged to carry power and traces 623 and 624 may be arranged to carry ground. In another example, traces 621 and 622 may be arranged to carry ground and traces 623 and 624 may be arranged to carry power.

Differences between substrate 650 (FIG. 6) and substrate 250 (FIG. 2A) also include differences between elements in layer 254 in substrate 250 and layer 654 in substrate 650. For example, in FIG. 2A, layer 254 of substrate 250 may include planes 241 and 242 (e.g., power delivery planes) arranged to carry power, ground, or both. In FIG. 6, in layer 654 of substrate 650, traces 641, 642, 643, and 644 may be separated (e.g., electrically isolated) from each other. Traces 641, 642, 643, and 644 may be arranged to carry power, ground, or both. For example, traces 641 and 642 may be arranged to carry power and traces 643 and 644 may be arranged to carry ground. In another example, traces 641 and 642 may be arranged to carry ground and traces 643 and 644 may be arranged to carry power.

Figure 7:
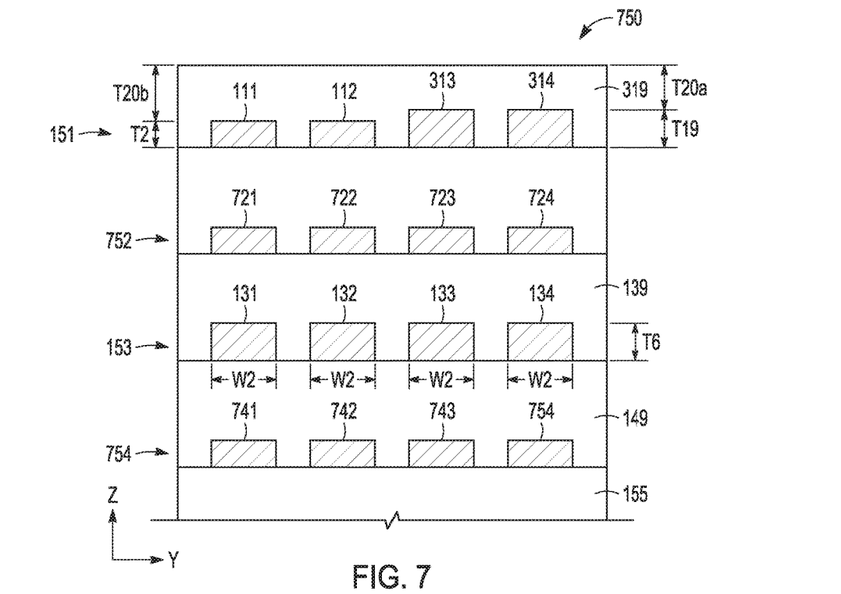
FIG. 7 shows a cross section of a portion of a substrate (which may be an alternative for the substrate of FIG. 3) including separate traces arranged to carry at least one of power and ground, according to some embodiments described herein.

FIG. 7 shows a cross section of a portion of a substrate 750 including traces 721, 722, 723, and 724 and traces 741, 742, 743, and 744 arranged to carry at least one of power and ground, according to some embodiments described herein. Substrate 750 may be an alternative for substrate 350 of FIG. 3. Substrate 750 may be substituted for substrate 150 in package 101 (FIG. 1A and FIG. 1B). Substrate 750 (FIG. 7) may include elements similar to or identical to those of substrate 350 shown in FIG. 3. Similar or identical elements between substrates 350 and 750 are given the same reference numbers. For simplicity, description of similar or identical elements between substrates 350 and 750 is not described in the description of substrate 750 in FIG. 7.

Differences between substrate 750 (FIG. 7) and substrate 350 (FIG. 3) include differences between elements in layer 152 in substrate 350 and layer 752 in substrate 750. For example, in FIG. 3, layer 152 of substrate 350 may include a single plane (e.g., power delivery plane) 120 arranged to carry power or ground. In FIG. 7, layer 752 of substrate 750 may include traces 721, 722, 723, and 724 separated (e.g., electrically isolated) from each other.

Differences between substrate 750 (FIG. 7) and substrate 350 (FIG. 3) also include differences between elements in layer 154 in substrate 350 and layer 754 in substrate 750. For example, in FIG. 3, layer 154 of substrate 350 may include a single plane (e.g., power or ground plane) 140 arranged to carry power or ground. In FIG. 7, layer 754 of substrate 750 may include traces 741, 742, 743, and 744 separated (e.g., electrically isolated) from each other. Traces 741, 742, 743, and 744 may be arranged to carry power, ground, or both.

Figure 8:
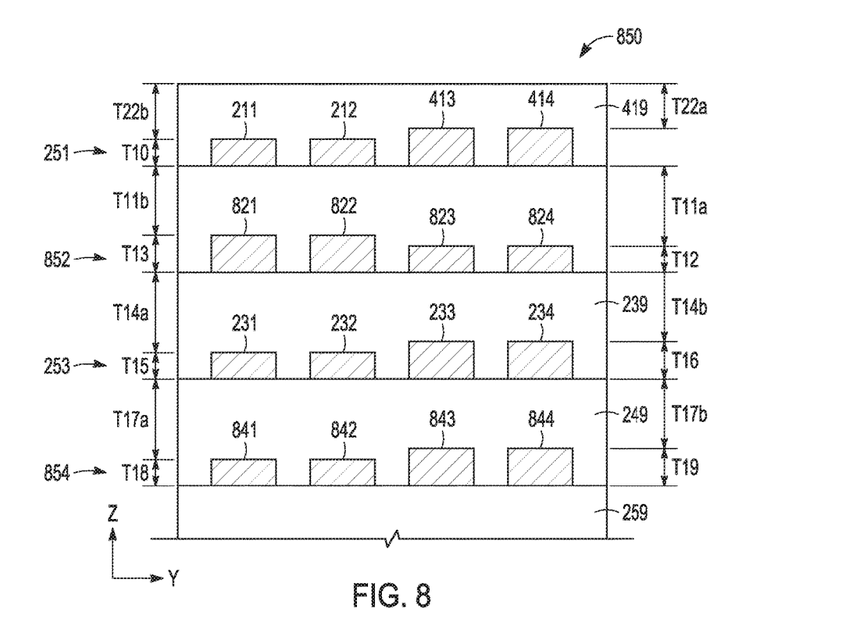
FIG. 8 shows a cross section of a portion of a substrate (which may be an alternative for the substrate of FIG. 4) including separate traces arranged to carry at least one of power and ground, according to some embodiments described herein.

FIG. 8 shows a cross sections of a portion of a substrate 850 including traces 821, 822, 823, and 824 and traces 841, 842, 843, and 844 arranged to carry at least one of power and ground, according to some embodiments described herein. Substrate 850 may be an alternative for substrate 450 of FIG. 4. Substrate 850 may be substituted for substrate 150 in package 101 (FIG. 1A and FIG. 1B). Substrate 850 (FIG. 8) may include elements similar to or identical to those of substrate 450 shown in FIG. 8. Similar or identical elements between substrates 450 and 850 are given the same reference numbers. For simplicity, the description of similar or identical elements between substrates 450 and 850 is not described in the description of substrate 850 in FIG. 8.

Differences between substrate 850 (FIG. 8) and substrate 450 (FIG. 4) include differences between elements in layer 252 in substrate 450 and layer 852 in substrate 850. For example, in FIG. 4, layer 252 of substrate 450 may include planes 221 and 222 (e.g., power delivery planes) arranged to carry power, ground, or both. In FIG. 8, in layer 852 of substrate 850, traces 821, 822, 823, and 824 may be separated (e.g., electrically isolated) from each other. Traces 821, 822, 823, and 824 may be arranged to carry power, ground, or both. For example, traces 821 and 822 may be arranged to carry power and traces 823 and 824 may be arranged to carry ground. In another example, traces 821 and 822 may be arranged to carry ground and traces 823 and 824 may be arranged to carry power.

Differences between substrate 850 (FIG. 8) and substrate 450 (FIG. 4) also include differences between elements in layer 254 in substrate 450 and layer 854 in substrate 850. For example, in FIG. 4, layer 254 of substrate 450 may include planes 241 and 242 (e.g., power delivery planes) arranged to carry power, ground, or both. In FIG. 8, in layer 854 of substrate 850, traces 841, 842, 843, and 844 may be separated (e.g., electrically isolated) from each other. Traces 841, 842, 843, and 844 may be arranged to carry power, ground, or both. For example, traces 841 and 842 may be arranged to carry power and traces 843 and 844 may be arranged to carry ground. In another example, traces 841 and 842 may be arranged to carry ground and traces 843 and 844 may be arranged to carry power.

FIG. 9A through FIG. 9D show some processes of forming a portion of a substrate 950, according to some embodiments described herein. The processes associated with FIG. 9A through FIG. 9D may be performed such that traces in the same layer of substrate 950 may have the same thickness, and traces between different layers of substrate 950 may have different thicknesses. The processes associated with FIG. 9A through FIG. 9D may be used to form a portion of any of the substrates described above with reference to FIG. 1A through FIG. 8, including a portion of substrate 150 (FIG. 1C).

Figure 9A:
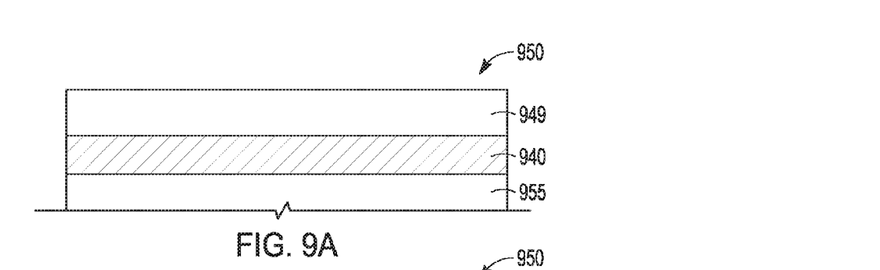
FIG. 9A through FIG. 9D show some processes of forming a portion of a substrate including traces in different layers having different thicknesses, according to some embodiments described herein.

FIG. 9A shows substrate 950 after a plane 940 (e.g., power delivery plane) and a dielectric 949 have been formed over a layer 955 of substrate 950. Layer 955 may include any combination of a core, a buildup layer, and other layers of substrate 950 below plane 940. For example, layer 955, plane 940, and dielectric 949 may correspond to core 155, plane 140, and dielectric 149, respectively, of substrate 150 (FIG. 1C). Plane 940 in FIG. 9A may be formed before dielectric 949 is formed. For example, forming plane 940 may include forming (e.g., by plating) a conductive material (e.g., a metal such as copper) over layer 955. Forming dielectric 949 may include forming an electrically non-conductive material (e.g., as a buildup layer) over plane 940. Dielectric 949 may be formed by lamination, printing, or other techniques.

Figure 9B:
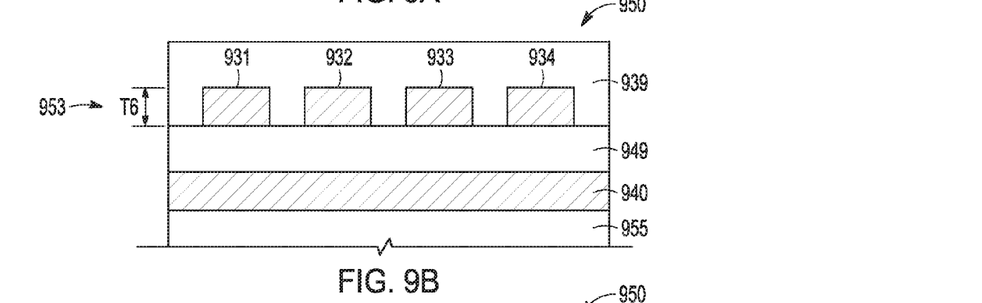

FIG. 9B shows substrate 950 after traces 931, 932, 933, and 934 and a dielectric 939 have been formed over dielectric 949 of substrate 950. Traces 931, 932, 933, and 934 and dielectric 939 may correspond to traces 131, 132, 133, and 134 and dielectric 139, respectively, of substrate 150 (FIG. 1C). Traces 931, 932, 933, and 934 in FIG. 9B may be formed before dielectric 939 is formed. For example, forming traces 931, 932, 933, and 934 may include forming (e.g., by plating) a conductive material (e.g., a metal such as copper) over dielectric 949. Forming dielectric 939 may include forming an electrically non-conductive material (e.g., as a buildup layer) over traces 931, 932, 933, and 934. Dielectric 939 may be formed by lamination, printing, or other techniques. Traces 931, 932, 933, and 934 are formed such that they may be located in the same layer (e.g., layer 953) of substrate 950 and may have the same thickness, such as thickness T6.

Figure 9C:
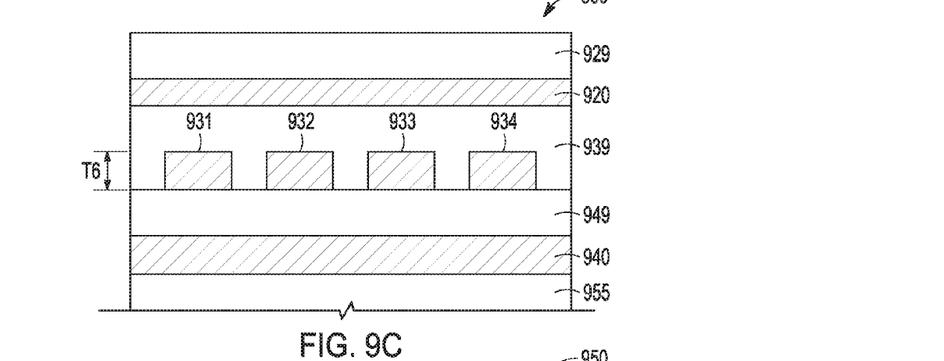

FIG. 9C shows substrate 950 after plane 920 (e.g., power delivery plane) and a dielectric 929 have been formed over dielectric 939 of substrate 950. Plane 920 and dielectric 929 may correspond to plane 120 and dielectric 129, respectively, of substrate 150 (FIG. 1C). Plane 920 in FIG. 9C may be formed before dielectric 929 is formed. For example, forming plane 920 may include forming (e.g., by plating) a conductive material (e.g., a metal such as copper) over dielectric 939. Forming dielectric 929 may include forming an electrically non-conductive material (e.g., as a buildup layer) over plane 920. Dielectric 929 may be formed by lamination, printing, or other techniques.

Figure 9D:
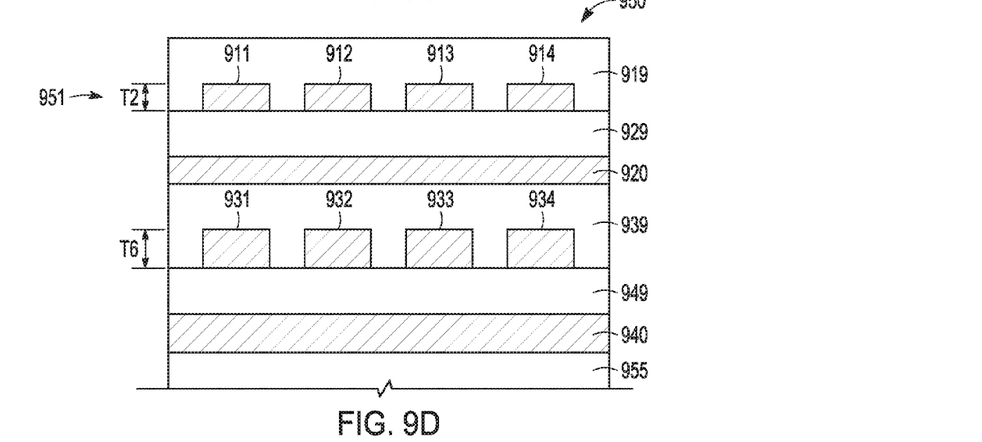

FIG. 9D shows substrate 950 after traces 911, 912, 913, and 914 and a dielectric 919 have been formed over a dielectric 929 of substrate 950. Traces 911, 912, 913, and 914 and dielectric 919 may correspond to traces 111, 112, 113, and 114 and dielectric 119, respectively, of substrate 150 (FIG. 1C). Traces 911, 912, 913, and 914 in FIG. 9D may be formed before dielectric 919 is formed. For example, forming traces 911, 912, 913, and 914 may include forming (e.g., by plating) a conductive material (e.g., a metal such as copper) over dielectric 929. Forming dielectric 919 may include forming an electrically non-conductive material (e.g., as a buildup layer) over traces 911, 912, 913, and 914. Dielectric 919 may be formed by lamination, printing, or other techniques. As shown in FIG. 9D, traces 911, 912, 913, and 914 are formed such that they may be located in the same layer (e.g., layer 951) of substrate 950 and may have the same thickness, such as thickness T2. Thickness T2 and T6 may correspond to the same thickness T2 and T6, respectively, described above with referenced to FIG. 1C. For example, thickness T6 may be greater than thickness T2.

FIG. 10A through FIG. 10E show some processes of forming a portion of a substrate 1050, according to some embodiments described herein. The processes associated with FIG. 10A through FIG. 10E may be performed such that traces in the same layer of substrate 1050 may have different thicknesses. The processes associated with 10A through FIG. 10E may be used to form a portion of any of the substrates described above (e.g., substrate 250, 350, 450, 550, 650, 750, and 850) described above with reference to FIG. 2A through FIG. 8.

Figure 10A:
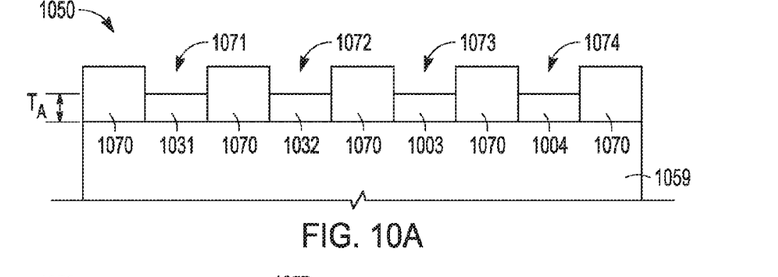
FIG. 10A through FIG. 10E show some processes of forming a portion of a substrate including traces in the same layer having different thicknesses, according to some embodiments described herein.

FIG. 10A shows substrate 1050 after traces 1031, 1032, 1003, and 1004 have been formed over a layer 1059 of substrate 1050. Layer 1059 may include a core, a buildup layer, or other layer of substrate 1050 below traces 1031, 1032, 1003, and 1004. For example, layer 1059 may correspond to layer 249 of substrate 250 (FIG. 2A). Forming traces 1031, 1032, 1003, and 1004 in FIG. 10A may include forming (e.g., patterning) openings 1071, 1072, 1073, and 1074 in a resist (e.g., dry film resist) 1070 that overlies layer 1059. Some portions of layer 1059 (that are not covered by resist 1070) may be exposed at openings 1071, 1072, 1073, and 1074. After openings 1071, 1072, 1073, and 1074 are formed, a conductive material (e.g., a metal such as copper) may be formed (e.g., may be plated) in openings 1071, 1072, 1073, and 1074 to form traces 1031, 1032, 1003, and 1004 having a thickness (e.g., target thickness) $T_A$. Thickness $T_A$ may correspond to thickness T15 of traces 231 and 232 (FIG. 2A), thickness T2 of traces 111 and 112 of substrate 350 (FIG. 3), or thickness T10 of traces 211 and 212 of substrate 450 (FIG. 4).

Figure 10B:
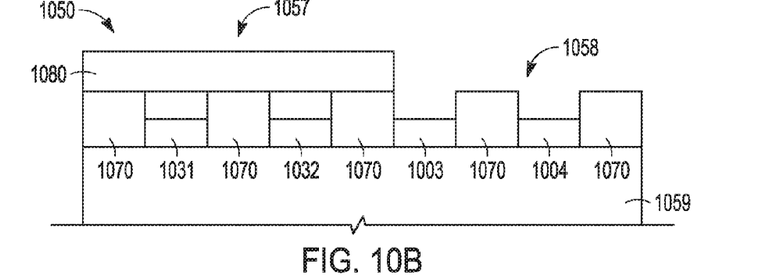

FIG. 10B shows substrate 1050 after a resist (e.g., dry film resist) 1080 has been formed over a selected portion of substrate 1050. For example, resist 1080 may be formed such that it may cover only portion 1057 of substrate 1050 including the area of substrate 1050 where traces 1031 and 1032 are located. Resist 1080 may not cover (e.g., leave uncovered) a portion 1058 of substrate 1050 including the area of substrate 1050 where traces 1003 and 1004 are located.

Figure 10C:
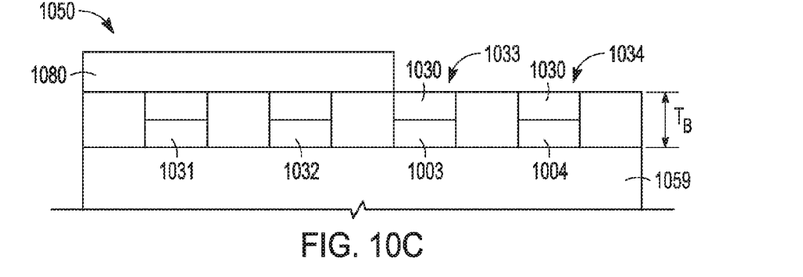

FIG. 10C shows substrate 1050 after traces 1033 and 1334 has been formed. Forming traces 1033 and 1034 may include forming an additional conductive material 1030 (e.g., a metal such as copper) over traces 1003 and 1004. The additional conductive material 1030 (FIG. 10C) and the conductive material (FIG. 10A) previously used to form traces 1003 and 1004 may combine to form traces 1033 and 1034. Traces 1033 and 1034 may be formed such that they have a thickness (e.g., target thickness) $T_B$, which is different from thickness $T_A$. Thickness $T_B$ may be greater than thickness $T_A$. Thus, as shown in FIG. 10C, traces 1031, 1032, 1033, and 1034 are formed such that they may have different thicknesses $T_A$ and $T_B$ and may be located in the same layer (e.g., layer 1053) of substrate 1050.

Thickness $T_B$ may correspond to thickness T16 of traces 233 and 234 (FIG. 2A), thickness T19 of traces 313 and 314 of substrate 350 (FIG. 3), or thickness T21 of traces 413 and 414 of substrate 450 (FIG. 4).

Figure 10D:
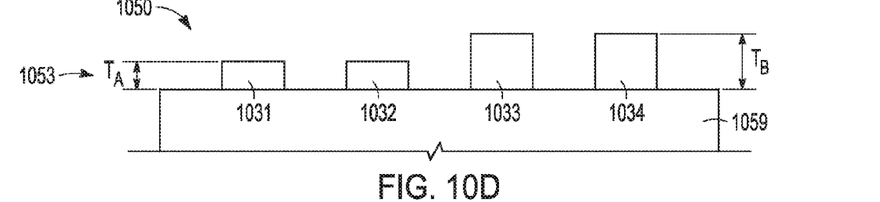

FIG. 10D shows substrate 1050 after resist 1070 and resist 1080 have been removed.

Figure 10E:
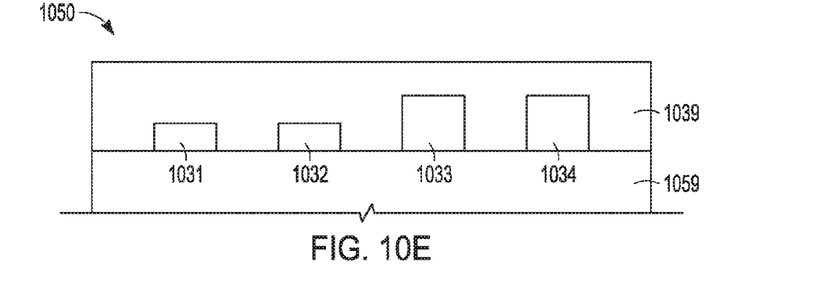

FIG. 10E shows substrate 1050 after a dielectric 1039 has been formed over traces 1031, 1032, 1033, and 1034. Forming dielectric 1039 may include forming an electrically non-conductive material (e.g., as a buildup layer) over traces 1031, 1032, 1033, and 1034. Dielectric 1039 may be formed by lamination, printing, or other techniques.

Traces 1031, 1032, 1033, and 1034 may correspond to traces 231, 232, 233, and 234, respectively, of FIG. 2A, traces 111, 112, 313, and 314, respectively, of FIG. 3, or traces 211, 212, 413, and 414, respectively, of FIG. 4.

The processes described above with reference to FIG. 10A through FIG. 10E may also be used to form power delivery planes (or power delivery traces) in the same layer of a substrate where the power delivery planes (or power delivery traces) may have different thicknesses. For example, the processes described above with reference to FIG. 10A through FIG. 10E may be used to form planes 211 and 222 (FIG. 2A), planes 241 and 242 (FIG. 2A), traces 621, 622, 623, and 624 (FIG. 6), traces 641, 642, 643, and 644 (FIG. 6), and traces 741, 742, 743, and 744 (FIG. 7).

The above description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. A method comprising:
    forming a first trace on a first layer of a substrate, the first trace having a first thickness;
    forming a second trace on a second layer of the substrate, the second trace having a second thickness different from the first thickness;
    forming a first pad coupled to the first trace;
    forming a second pad coupled to the second trace;
    forming a third trace on the first layer of a substrate, the third trace having a third thickness different from the first thickness of the first trace;
    forming a fourth trace on the second layer of a substrate, the fourth trace having a fourth thickness different from the second thickness of the second trace, wherein neither the first trace nor the third trace is electrically coupled to the second and fourth traces;
    forming a first dielectric over the first trace and directly contacting the first trace; and
    forming a second dielectric over the second trace and directly contacting the second trace.

2. The method of claim 1, wherein the first and second dielectrics layers have different thicknesses.

3. The method of claim 1, wherein the first and third traces are formed from micro-strips.

4. The method of claim 1, wherein the first and third traces are formed from strip-lines.

5. The method of claim 1, further comprising:
    forming a ground plane between the first and second traces.

6. The method of claim 5, further comprising:
    forming a power plane between the first and second traces.

7. A method comprising:
    forming a first layer of a substrate, including forming a first trace and a first additional trace of the first layer, the first trace and the additional first trace having different thicknesses, and the additional trace coupled to a pad of the substrate;
    forming a second layer of the substrate, including forming a second trace and a second additional trace of the second layer, the second trace and the additional second trace having different thicknesses, wherein neither the first trace nor the first additional trace is electrically coupled to the second trace and the second additional trace;
    forming a first dielectric over the first trace and directly contacting the first trace;
    forming a second dielectric over the second trace and directly contacting the second trace;
    forming a third layer of the substrate, including forming at least one of a ground plane and a power plane layer of the third layer; and
    arranging a die on the substrate, such that the pad is located outside a footprint of the die.

8. The method of claim 7, wherein the first trace is formed such that the first trace is coupled to a first additional pad of the substrate, and the first additional pad is located outside the footprint of the die.

9. The method of claim 8, wherein the first trace is formed such that the first trace is coupled to a second additional pad of the substrate, and the second additional pad is located inside the footprint of the die.

10. The method of claim 7, wherein at least one of the ground plane and the power plane has a thickness different from one of the first and second thicknesses.

11. The method of claim 7, wherein the die includes a processor.

* * * * *